US006777164B2

(12) United States Patent
Horne et al.

(10) Patent No.: US 6,777,164 B2
(45) Date of Patent: Aug. 17, 2004

(54) LITHOGRAPHIC PRINTING FORMS

(75) Inventors: Geoffrey Horne, Leeds (GB); Kevin Barry Ray, Fort Collins, CO (US); Alan Stanley Victor Monk, Cheshire (GB); Stuart Bayes, Leeds (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/828,075

(22) Filed: Apr. 6, 2001

(65) Prior Publication Data

US 2002/0172874 A1 Nov. 21, 2002

(51) Int. Cl.[7] .......................... G03C 1/77; G03F 7/038; G03F 7/039; G03F 7/09; G03F 7/30; B41N 1/08; B41N 1/055

(52) U.S. Cl. ............................... 430/278.1; 430/287.1; 430/302; 430/306; 430/326; 430/14; 430/292; 430/905; 430/909; 430/926; 430/944; 101/456; 101/457; 101/465; 101/467; 101/470

(58) Field of Search .......................... 430/278.1, 287.1, 430/302, 306, 326, 944, 905, 909, 926, 14, 292; 101/456, 457, 465, 467, 470

(56) References Cited

U.S. PATENT DOCUMENTS

| | | | | |
|---|---|---|---|---|
| 5,200,292 A | | 4/1993 | Shinozaki et al. | 430/178 |
| 6,074,797 A | * | 6/2000 | Suezawa et al. | 430/166 |
| 6,124,425 A | * | 9/2000 | Nguyen | 528/422 |
| 6,170,292 B1 | * | 1/2001 | Boulos et al. | 65/30.1 |
| 6,447,895 B1 | * | 9/2002 | Kamir et al. | 428/311.11 |

FOREIGN PATENT DOCUMENTS

| | | |
|---|---|---|
| WO | 9739894 | 10/1997 |
| WO | 9901795 | 1/1999 |
| WO | 9921715 | 5/1999 |
| WO | 9921725 | 5/1999 |

OTHER PUBLICATIONS

S. Wernick et al., "The Surface Treatment and Finishing of Aluminum and its Alloys", 5th Edition, 1987, 0–904477–09–6; pp. 184–189.

* cited by examiner

*Primary Examiner*—Mark F. Huff
*Assistant Examiner*—Sin J. Lee
(74) *Attorney, Agent, or Firm*—Faegre & Benson LLP

(57) ABSTRACT

The invention provides a lithographic printing for precursor having an imagable coating on an aluminum support, wherein the imagable coating comprises a polymeric substance comprising colorant groups, and wherein the aluminum support on which the coating is provided is anodized but not subsequently modified by means of a post-anodic treatment compound, and the coating does not comprise a colorant dye. The polymeric substance may also comprise pendent infra-red or developer dissolution inhibiting groups, and these groups may also be the colorant groups themselves.

22 Claims, No Drawings

LITHOGRAPHIC PRINTING FORMS

BACKGROUND OF INVENTION

This invention relates to lithographic printing forms and to precursors thereto, having aluminum supports bearing imagable coatings. The invention relates further to the manufacture of such precursors, and their use.

Typical lithographic printing form precursors are prepared as follows.

Aluminum sheet is subjected to a graining or roughening treatment. This may be a mechanical graining treatment, for example brush graining or ball graining, or an electrograining treatment (also called electrochemical etching or electrochemical roughening) in a mineral acid. The sheet is then anodised, to provide a hard hydrophilic surface, which has a microporous "honeycomb" structure. Anodising may typically take place in a sulphuric acid or phosphoric acid electrolyte. A post-anodic treatment (PAT) is then carried out, using, for example, a silicate or a phosphate composition. Subsequently a different composition, containing a polymeric substance, is applied in a liquid form, a solvent being removed therefrom to leave the imagable coating as a dry film on the aluminum sheet, which may be cut into individual lithographic printing form precursors. The resultant precursors may be imaged and developed, to provide the lithographic printing forms which are printed from. During development, portions of the coating are selectively removed. In positive working systems portions which were exposed are removed. In negative working systems portions which were not exposed are removed. In most systems, whether positive or negative, the remaining portions of the coating are preferentially ink-accepting.

Many coatings contain dyes and these may be employed for several distinct reasons. A dye may alter the properties of the polymeric substance, for example by rendering it insoluble in a developer, but such that after imaging, the coating is soluble in the developer. Examples of such dyes are given in PCT/GB97/39894. A dye may function as an absorber of imaging radiation, either as a "spectral sensitizer", to emit radiation of a different wavelength which triggers a desired chemical reaction to alter the properties of the coating, or as a compound which converts the absorbed radiation to heat, which alters the properties of the coating. Examples of dyes functioning as spectral sensitizers are given in U.S. Pat. No. 5,200,292. Examples of dyes converting imaging radiation to heat are given in PCT/GB97/39894. Additionally, a dye may be used to color a coating, with the result that after development a positive or negative image can be seen on the printing plate, from the color contrast. From this the printer can gain an impression of whether imaging and development has been successful and can identify and correct faults.

If the PAT step is not carried out colored dye present in the coating may be seen in the regions from which the portions of the coating are removed on development; the dye may form an absorbed or residual layer on the anodised surface. This is undesirable as it reduces the color contrast between exposed and unexposed portions of the printing plates and makes it harder for the printer to determine whether imaging and development has been successful, and to identify and correct faults. Furthermore dye which is present in uncoated areas may attract ink and cause poor printing performance.

SUMMARY OF THE INVENTION

The invention relates to the use in a lithographic printing form precursor of a polymeric compound comprising pendent colorant groups. This gives the required color contrast. Free colorant dye is not needed and it is not necessary to employ a PAT step, in the preparation of an aluminum lithographic support.

DETAILED DESCRIPTION OF THE INVENTION

In accordance with a first aspect of the present invention there is provided a lithographic printing form precursor having an imagable coating on an aluminum support, wherein the imagable coating comprises a polymeric substance comprising colorant groups, wherein the aluminum support on which the coating is provided is anodized but not subsequently modified by means of a post-anodic treatment compound, and wherein the coating does not comprise a free colorant dye.

Such a polymeric substance of the invention is referred to herein as a "colorant tagged polymer".

By "colorant dye" we mean a dye which reduces the color contrast between exposed and unexposed portions of a printing plate after development of the plate, when retained on the developed plate. By "free colorant dye" we mean a colorant dye which is not pendent on the polymeric substance.

The term "aluminum" as used herein includes aluminum alloys.

Preferably both sides of the aluminum sheet are anodised, to reduce the risk of corrosion attack in a developer.

Preferably a graining step is carried out prior to the anodising step, for example mechanical graining or electrograining, as described briefly above. Preferably electrograining is carried out. The anodising step which follows may suitably take place in a phosphoric acid or, especially, a sulphuric acid electrolyte. The technology of graining and anodising is very well known to the skilled person but if background information is needed, the reader may refer to "The Surface Treatment and Finishing of Aluminum and its Alloys", S. Wernick et al, $5^{th}$ edition; 1987,ISBN 0-904477-09-6, pp 184–189.

As well as avoiding staining and removing a manufacturing step we have found that the printing form precursors of the invention yield, after steps of imaging and development, printing forms which have longer run lengths than similar printing forms, employing a polymeric substance without colorant groups thereon, employing an admixed colorant dye, and which have had a post-anodic chemical treatment step.

A precursor made by a method in accordance with the invention may have a coating formed as a single layer or as two, or more, layers.

In accordance with the examples herein good results were found with positive working compositions, which are preferred embodiments of the invention, but a precursor made by a method in accordance with the invention may be positive working or negative working.

Preferably the corresponding polymeric substance without any pendent colorant groups (referred to herein as the parent polymer), has nucleophilic groups Y, able to react with a colorant compound or moiety, having a halogen atom, for example a chlorine atom. Preferably the parent polymer has groups Y selected from —$SO_2$NHR, —NHR, —SH and —OH, where R represents a hydrogen atom or a $C_{1-4}$ alkyl group, for example a methyl group. Preferably R represents a hydrogen atom. More preferably the parent polymer has sulfonamido groups or hydroxyl groups Y, or both.

Since it is unlikely or undesirable, or both, that all such groups of the parent polymer are functionalized by the reaction, preferably the colorant-tagged polymer also has such groups Y. Most preferably, the parent polymer has hydroxyl groups Y.

A hydroxyl group-containing polymer, useful as a parent polymer may comprise a phenolic resin or co-polymer thereof. Other polymers suitable as parent polymers include poly-4-hydroxystyrene; copolymers of 4-hydroxystyrene, for example with 3-methyl-4-hydroxystyrene or 4-methoxystyrene; copolymers of (meth)acrylic acid, for example with styrene; copolymers of maleiimide, for example with styrene; hydroxy or carboxy functionalised celluloses; dialkylmaleiimide esters; copolymers of maleic anhydride, for example with styrene; and partially hydrolysed polymers of maleic anhydride.

Particularly useful phenolic resins in this invention are the condensation products from the interaction between phenol, C-alkyl substituted phenols (such as cresols and p-tert-butyl-phenol), diphenols (such as bisphenol-A) and aldehydes and ketones (such as formaldehyde and acetone). Depending on the preparation route for the condensation a range of phenolic materials with varying structures and properties can be formed, as will be well understood to those skilled in the art. One useful class is pyrogallol/acetone condensates. Particularly useful in this invention are novolak resins, resole resins and novolak/resole resin mixtures. Most preferred are novolak resins. Examples of suitable novolak resins have the following general structure:

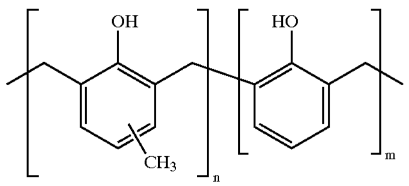

where the ratio of n:m is in the range of 1:20 to 20:1, preferably 3:1 to 1:3. In one preferred embodiment, n=m. However, in certain embodiments n or m may be zero. Novolak resins suitable for use have a molecular weight in the range of about 500–20,000, preferably in the range of about 1000–15,000, preferably about 2500–10,000.

Novolak resins useful in this invention are suitably condensation reaction products between appropriate phenols, for example phenol itself, C-alkyl substituted phenols (including cresols, xylenols, p-tert-butyl-phenol, p-phenylphenol and nonyl phenols), diphenols (e.g. bisphenol-A (2,2-bis(4-hydroxyphenyl)propane)), and appropriate aldehydes, for example formaldehyde, chloral, acetaldehyde and furfuraldehyde. As will be well understood by those skilled in the art, the type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is typically used to prepare novolak resins, which are thermoplastic in character. Higher aldehyde:phenol ratios of more then 1:1 to 3:1, and a basic catalyst, give rise to resole resins, and these are characterised by their ability to be thermally hardened at elevated temperatures.

The hydroxyl group-containing polymer may comprise a polyhydroxystyrene resin or co-polymer thereof, of general formula:

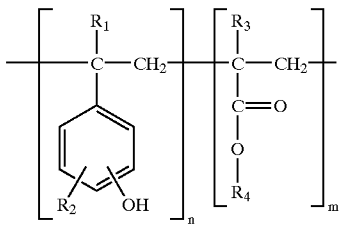

wherein $R_1$ represents a hydrogen atom or alkyl group, $R_2$ represents a hydrogen atom or alkyl group, $R_3$ represents a hydrogen atom or alkyl group, $R_4$ is an alkyl or hydroxyalkyl group, and the ratio n/m is in the range 10/0 to 1/10.

In general terms, any alkyl group is suitably a $C_{1-12}$ alkyl group, preferably a $C_{1-6}$ alkyl group, especially a $C_{1-4}$ alkyl group. An alkyl group may be branched (for example t-butyl) or straight chain (for example n-butyl).

$R_1$ preferably represents a hydrogen atom or a $C_{1-4}$ alkyl group, especially a methyl group. Most preferably $R_1$ represents a hydrogen atom.

$R_2$ preferably represents a hydrogen atom or a $C_{1-4}$ alkyl group, especially a methyl group. Most preferably $R_2$ represents a hydrogen atom.

The hydroxy substituent of the phenyl group shown is preferably located para to the linkage of the phenyl group to the polymer backbone. $R_3$ preferably represents a hydrogen atom or a $C_{1-4}$ alkyl group, especially a methyl group. Most preferably $R_3$ represents a hydrogen atom.

$R_4$ preferably represents a $C_{1-6}$ alkyl or $C_{1-6}$ hydroxyalkyl group. When it represents a hydroxyalkyl group the hydroxy group is preferably carried by the terminal carbon atom of the alkyl group. Examples of suitable groups $R_4$ are $-CH_3$, $-CH_2CH_2OH$, and $-CH_2CH_2CH_2CH_3$. Preferably the ratio n/m is in the range 10/1 to 1/10, preferably 5/1 to 1/2. More preferably the ratio n/m is in the range 2/1 to 2/3. Most preferably the ratio n/m is in the range 3/2 to 2/3, especially 1/1.

The weight average molecular weight Mw of the polyhydroxystyrene polymer drawn above, as measured by gel permeation chromatography, is preferably in the range 5,000–75,000, especially 7,000–50,000. The number average molecular weight Mn of the polymer is preferably in the range 2,000–20,000, especially 3,000–8,000.

The colorant-tagged polymer may be prepared from the parent polymer by reaction between the colorant moiety or compound, having a reactive halogen atom, and the parent polymer, under standard conditions to promote the required dehydrohalogenation. Typically alkaline dehydrohalogenation will be effective, at an elevated temperature, suitably under reflux. For example, the colorant-tagged polymer may be prepared by reacting an appropriate parent polymer with a dye having a labile halogen atom, under alkaline conditions at an elevated temperature, to promote dehydrohalogenation. The same method may be used to introduce other pendent groups of the type previously described, in embodiments in which such groups are present.

Preferably the reaction is carried out such that nucleophilic groups Y remain. After reaction the number ratio of remaining nucleophilic groups Y to colorant groups X, in the resultant colorant-tagged polymer, is suitably at least 2:1, preferably at least 5:1, more preferably at least 10:1. Suitably the ratio does not exceed 100:1. Preferably it does not exceed 50:1. Most preferably it does not exceed 40:1.

The colorant property of the colorant-tagged polymer is preferably effected by pendent colorant groups on the polymer. Such groups may be chromophores per se. Alternatively the colorant property may be brought about by colorant groups pendent on the polymer, and functioning as chromophores through interaction with the polymer.

Colorant compounds or moieties suitable for use as colorant groups on the colorant-tagged polymer are quaternized nitrogen-containing triarylmethane dyes, including Crystal Violet (CI basic violet 3), Victoria Blue and Ethyl Violet; quaternized heterocyclic compounds, including Monazoline C, Monazoline O, Monazoline CY and Monazoline T, all of which are manufactured by Mona Industries quinolinium compounds, such as 1-ethyl-2-methyl quinolinium iodide and 1-ethyl-4-methyl quinolinium iodide, benzothiazolium iodide, and pyridinium compounds such as cetylpyridinium bromide, ethyl viologen dibromide and fluoropyridinium tetrafluoroborate.

Other compounds or moieties useful as colorant groups on the colorant-tagged polymer include Methylene Blue (CI Basic blue 9), polymethine dyes, cyanine dyes, Acidic Orange (CI Solvent orange 15) and a dye having the cation

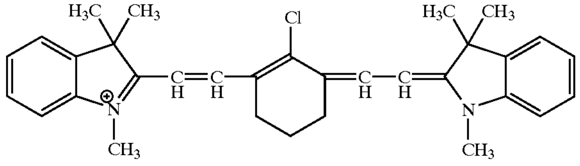

Useful quinolinium or benzothiazolium compounds are cationic cyanine dyes, such as Quinoldine Blue and 3-ethyl-2-[3-(3-ethyl-2-(3H)-benzothiazolyidene)-2-methyl-1-propenyl]benzothiazolium iodide, and the compound having a cation of formula

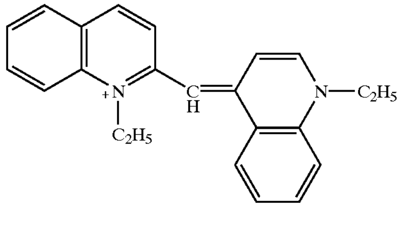

Suitably the colorant-tagged polymer may include additional functional groups which act as infra-red absorbing groups.

A colorant-tagged polymer useful in positive working compositions of this invention preferably has at least one pendent colorant group which is also an infra-red absorbing group, and the polymer initially does not dissolve in a developer liquid. However, when the polymer is subjected to infra-red radiation and/or heat, the polymer dissolves in the developer liquid. In one preferred embodiment, the polymer has functional groups independently selected from —SONHR, —NHR, —SH and —OH, where R is H or a $C_1$–$C_4$ alkyl group, and the polymer additionally has pendent colorant groups which absorb infra-red radiation, such as polymethine dye and cyanine dye residues. The polymer may be prepared by reacting a parent polymer with a colorant compound which also acts as an infra-red absorbing compound.

The composition may additionally or alternatively comprise free infra-red absorbing compounds not pendent on the colorant-tagged polymer. Or course any separate infra-red absorbing compound should not be a colorant dye, but is either colorless or has such weak color that it will not affect the color contrast after imaging and development.

Suitably the colorant-tagged polymer includes functional groups which cause the developer solubility of the polymer to be lower than that of a corresponding polymer without such functional groups, but such that the developer solubility of the polymer is increased on exposure to heat and/or infra-red radiation. Preferably the functional groups are also colorant groups. Said functional groups are hereinafter called “reversible insolubilizer groups”.

Reversible insolubilizer groups may include pendent functional groups carried by the polymer, additional to the colorant-tagged groups. The reversible insolubilizer groups may be additional to or alternative to any infra-red absorbing groups present on the colorant-tagged polymer. Suitable functional groups include those described in WO 99/01795, the contents of which are hereby incorporated in this specification by reference. Preferred groups are —O—$SO_2$-tolyl, —O-dansyl, —O—$SO_2$-thienyl, —O—$SO_2$-naphthyl and —O—CO—Ph.

Alternatively or additionally diazide functional groups may be carried by the polymer. When diazide groups are used in this invention, either in separate compounds admixed with the colorant-tagged polymer or as functional groups on the colorant-tagged polymer, as described above, they preferably comprise diazo groups (=$N_2$), preferably conjugated to carbonyl groups, preferably via an aromatic or heteroaromatic ring.

In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-naphthoquinonediazide (NQD) moieties.

A BQD moiety may, for example, comprise the 1,4- or, preferably 1,2-benzoquinonediazide moiety. An NQD moiety may, for example comprise the 1,4-, 2,1- or, most preferably, the 1,2-naphthoquinone diazide moiety. Generally, NQD moieties are preferred to BQD moieties, when diazide groups are used in the practice of the invention. The most preferred diazide moiety for use in the practice of this invention is the 1,2-naphthoquinonediazide moiety.

Preferably, however, the precursor does not contain any moieties which render it photosensitive to ambient electromagnetic radiation in the range 190 to 500 nm, preferably 190 to 700 nm. Thus, it preferably is insensitive to ambient visible and ultra-violet light.

The term “insensitive to ambient visible and ultra-violet light” means that the precursor does not undergo any substantial chemical or physical changes caused by ambient visible or ultra-violet light, which would diminish the imaging or development or printing performance of the precursor.

Preferred reversible insolubiliser groups may include infra-red absorbing groups. Thus, a preferred colorant-tagged polymer of the invention comprises functional groups X which act to inhibit the dissolution of the colorant-tagged polymer compared with the parent polymer, to absorb infra-red radiation and thereby yield heat, and to permit the colorant-tagged polymer to dissolve in the developer liquid, where thus heated. Most preferably, functional groups X are also colorant groups.

Preferred functional groups X, performing all of these functions described in the previous paragraph, are residues of infrared absorbing dyes, preferably polymethine dyes, more preferably cyanine dyes. One definition of a cyanine dye, as disclosed in Hawley's Condensed Chemical Dictionary ($12^{th}$ edition) (Van Nostrand Reinhold 1993), is a dye consisting of two heterocyclic groups connected by a chain of conjugated double bonds containing an odd number of carbon atoms. The definition includes isocyanines, merocyanines, cryptocyanines, phthalocyanines and dicyanines.

The several dissolution inhibition means described herein are not mutually exclusive. One example of a polymer which has two distinct dissolution inhibition means is a polymer having functional groups X as described above and diazide groups.

Preferably, the corresponding polymer without any pendent groups (referred to herein as the "parent polymer") dissolves in the developer liquid. Thus, the colorant-tagged polymer is preferably insolubilized by means of functional groups thereon.

In preferred embodiments the colorant-tagged polymer on its own has the property that it does not dissolve in the developer liquid but does dissolve once heated. In other embodiments the colorant-tagged polymer on its own may or may not have this property to any useful degree, but a free compound is present in the composition, and confers this property on the composition, or supplements it, by inhibiting the dissolution of the polymer in the developer liquid. Such a compound is hereinafter called a "reversible insolubilizer compound" Without wishing to be bound by any one theory, it is believed that a complex forms between such a compound and the colorant-tagged polymer, the complex being disturbed by heat.

A useful class of reversible insolubilizer compounds are carbonyl functional group containing compounds.

Examples of suitable carbonyl containing compounds are naphthoflavone, 2,3-diphenyl-1-indeneone, flavone, flavanone, xanthone, bezophenone, N-(4-(bromobutyl) phthalimde and phenanthenequinone.

A reversible insolubilizer compound may be a compound of general formula:

$$Q_1—S(O)_q—Q_2$$

where $Q_1$ represents an optionally substituted phenyl or alkyl group, q represents 0, 1 or 2, and $Q_2$ represents a halogen atom or any alkoxy group. Preferably $Q_1$ represents a $C_{1-4}$ alkyl phenyl group, for example a tolyl group, or a $C_{1-4}$ alkyl group. Preferably q represents 1 or, especially, 2. Preferably $Q_2$ represents a chlorine atom or a $C_{1-4}$ alkoxy group, especially an ethoxy group.

Other useful reversible insolubilizer compounds are ferrocenium compounds, such as ferrocenium hexafluorophosphate.

Alternatively or additionally diazide group-containing compounds, admixed with the colorant-tagged polymer, may be employed.

Suitably, when present as a separate compound, the reversible insolubilizer compound constitutes at least 0.25%, preferably at least 0.5%, more preferably at least 1%, most preferably at least 2% of the total weight of the composition.

Preferably, when present as a separate compound, the reversible insolubilizer compound constitutes up to 25%, more preferably up to 15% of the total weight of the composition.

Thus a preferred weight range for the reversible insolubilizer compound may be expressed as 2–15% of the total weight of the composition.

In yet other embodiments a cover layer is provided, which acts as a physical barrier preventing the colorant-tagged polymer from contact with the developer liquid. On exposure to infra-red radiation the heat generated by the colorant-tagged polymer acts on the cover layer, which no longer acts as a barrier, but allows the developer liquid to contact the underlying colorant-tagged polymer, in the heated areas.

The colorant-tagged polymer may comprise pendent groups which act as colorant groups, infra-red absorbing groups and reversible insolubilizer groups. There may be one type of pendent group which performs all three of the functions described above. Alternatively the colorant-tagged polymer may comprise pendent groups which perform two of the functions described above, and different pendent groups on the same polymer which perform the third function.

In another embodiment the colorant-tagged polymer may comprise three different types of pendent group, each of which perform one of the functions selected from colorant, infra-red absorber and reversible insolubilizer.

The composition useful in the invention may further comprise a pigment.

Pigments as defined herein are insoluble in the compositions and so comprise colorant particles therein, and in the dried coatings. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they have no or insignificant effect on the solubility of the unheated coatings in the developer. However some pigments may dissolve or break down in a developer and such pigments are within the ambit of the present invention provided that they do not thereby produce a colored solution which would cause staining.

Suitably the pigment constitutes at least 0.25%, preferably at least 0.5%, more preferably at least 1%, and most preferably at least 2%, of the total weight of the coating.

Suitably the pigment constitutes up to 25%, preferably up to 20%, and most preferably up to 15%, of the total weight of the coating.

References herein to the proportion of pigment are to their total content, when more than one pigment is employed.

Preferably the pigment is a material which can absorb infra-red radiation and convert it to heat. Examples include carbon pigments (for example the grades available as carbon black, lamp black, furnace black and channel black), black iron (III) oxide, manganese oxide, Milori Blue (C.I. Pigment Blue 27) available from Aldrich, Paris Blue available from Kremer, Prussian Blue, Heliogen Green available from BASF and Nigrosine Base NG1 available from NH Laboratories. However pigments which are not infra-red absorbers may be used for their colorant property. An example is copper phthalocyanine.

Preferably the composition contains a further polymeric component, being a polymer having hydroxyl groups as defined herein.

In accordance with a second aspect of the present invention there is provided a method of preparing a lithographic printing form precursor having an imagable coating on an aluminum support, the method comprising the steps of (a) anodising an aluminum sheet (which is to serve as the support); and (b) without having effected a chemical treatment step after the anodising step, applying a composition comprising a polymeric substance to the anodised surface of the aluminum sheet and drying the composition to form the imagable coating thereon, wherein the polymeric substance comprises pendent colorant groups, and wherein the composition does not contain a colorant dye.

In accordance with a third aspect of the invention there is provided a method of making a printing form from the printing form precursor of the second aspect, the method comprising the steps of:

(i) exposing the coating as described herein, imagewise; and (ii) removing the exposed regions of the coating using a developer liquid.

Preferably in a method of the invention which uses a positive working coating, the coating is such that it is imagewise solubilized by heat.

In the specification when we state that a coating is developer soluble we mean that it is soluble in a developer, to an extent useful in a lithographic printing form development process. When we state that a coating is developer insoluble we mean that it is not soluble in a developer, to an extent useful in a lithographic printing form development process.

The developer composition is dependent on the nature of the components of the composition, but is preferably an aqueous composition. Common components of aqueous developers are surfactants, chelating agents such as salts or ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates when the polymeric substance, as is preferred, is a phenolic resin.

It has been found that by carrying out a suitable heat treatment in accordance with the invention of WO 99/21715, the contents of which are hereinafter incorporated by reference, the performance of the coating may be improved, in particular rendered more consistent over time. It is preferred to carry out such a heat treatment at a temperature of at least 40° C., preferably at least 50° C., most preferably at least 60° C. As regards the upper limit, preferably the temperature is not in excess of 90° C., more preferably not in excess of 80° C., most preferably not in excess of 70° C. Temperatures in the range 60–70° C. are particularly preferred. Generally, the lower the temperature for the heat treatment, the longer the time should be. It is preferred to carry out the heat treatment for at least 4 hours; and more preferably for at least 24 hours and most preferably for at least 48 hours.

Preferably the sensitivity of the preferred coating of the precursors produced by the method of the invention is at a practicable level; suitably no more than 400 $mJcm^{-2}$, preferably no more than 250 $mJcm^{-2}$. A heat treatment as discussed above may be of assistance in achieving this.

Suitably the composition contains a developer resistance means as defined in WO 99/21725, suitably a siloxane, preferably constituting 0.1–10 wt %, more preferably 1–10 wt % of the composition. Preferred siloxanes are substituted by one or more optionally-substituted alkyl or phenyl groups, and most preferably are phenylalkylsiloxanes and dialkylsiloxanes. Preferred siloxanes have between 10 and 100 —$Si(R^1)(R^2)O$— repeat units. The siloxanes may be copolymerised with ethylene oxide and/or propylene oxide. For further information on preferred siloxanes the definitions in WO 99/21725 may be recited.

In certain embodiments of the invention heat is imagewise delivered conductively to the coating, by direct application. For example the coating may be contacted by a heat stylus; or the reverse face of the support surface bearing the coating may be contacted by a heat stylus.

In other embodiments of the invention electromagnetic radiation is preferably used to image the coating, the wavelength thereof preferably entirely or predominantly exceeding 500 nm. Preferably, it is of wavelength entirely or predominantly exceeding 600 nm. More preferably it is of wavelength entirely or predominantly exceeding 700 nm. Most preferably it is of wavelength entirely or predominantly exceeding 800 nm. Suitably it is of wavelength entirely or predominantly below 1400 nm. More preferably it is of wavelength entirely or predominantly below 1200 nm. Most preferably it is of wavelength entirely or predominantly below 1100 nm. Thus, suitably it is of wavelength entirely or predominantly in the range 600 to 1400 nm, more preferably 700 to 1200 nm, most preferably 800 to 1100 nm. The electromagnetic radiation is converted to heat by the pigment. Electromagnetic radiation is preferably delivered by a laser under digital control.

The precursors of the invention may be imaged with a laser or an array of lasers emitting infrared radiation in a wavelength region that closely matches the absorption spectrum of the infrared absorbing polymer. Suitable commercially available imaging devices include image setters such as a Creo Trendsetter (available from the Creo Corporation, British Columbia, Canada) and a Gerber Crescent 42T (available from the Gerber Corporation). Alternatively, the precursors of this invention may be imaged using an apparatus containing a thermal printing head or any other means for imagewise conductively heating the composite layer such as with a heated stylus.

The composition described herein may additionally contain other ingredients such as polymeric particles, stabilizing additives and additional inert polymeric binders as are well known to be present in many positive working compositions.

In accordance with a fourth aspect there is provided such a printing form, per se.

Preferably the printing form of the fourth aspect is used in a printing process without having undergone a post-development baking step. A post-development baking step can be carried out to obtain a substantial increase in run length achievable with a given printing form. However many customers do not want to, or cannot, subject their imaged and developed printing forms to a baking step but prefer instead to purchase precursors which can be used straight after development, that is, precursors which offer run lengths which are adequate without a post-development baking step.

In accordance with a fifth aspect of the present invention there is provided the use of a polymeric substance comprising pendent colorant groups as an additive in an imagable composition, to prevent the need for post anodic treatment of an anodized aluminum support coated with an imagable composition comprising said polymeric substance.

The following Examples more particularly serve to illustrate the various aspects of the present invention described hereinabove.

The following products are referred to hereafter:

Resin A—LB6564, a 1:1 phenol/cresol novolak resin supplied by Bakelite, UK.

Resin B—LB744, a cresol novolak resin supplied by Bakelite.

Dye A—KF654B PINA as supplied by Riedel de Haan UK, Middlesex, UK, believed to have the structure:

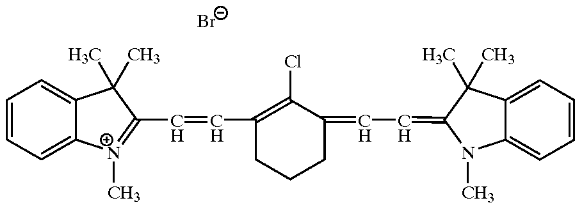

Dye B—Methylene blue (basic blue 9) as supplied by Aldrich, having the structure:

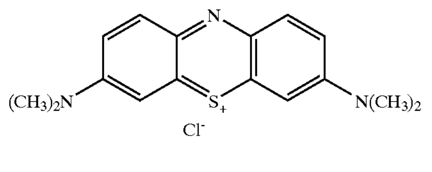

Resin C—LB 6564 resin capped with 5 mol-% KF654B PINA dye. Resin C has the structure:

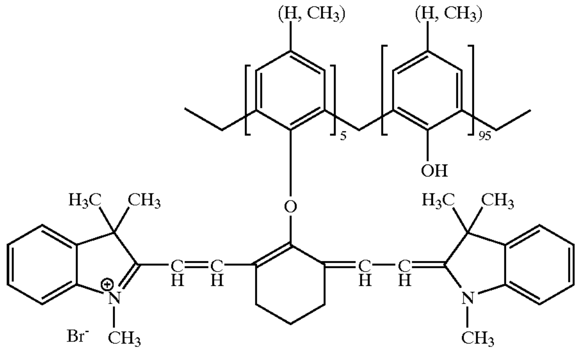

Resin D—having the structure:

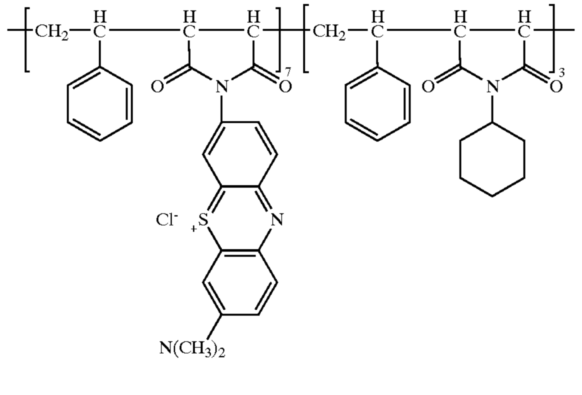

Developer A—14% wt sodium metasilicate pentahydrate in water.

Support A—0.3 mm thickness sheet aluminum, electrograined in hydrchloric acid and anodised in sulfuric acid, on both sides.

Support B—0.3 mm sheet aluminum, electrograined in hydrochloric acid and anodised in sulfuric acid, on both sides and post-anodically treated with an aqueous solution of an inorganic phosphate.)

Creo Trendsetter 3244—a commercially-available plate setter, using Procomm Plus Software, operating at a wavelength of 830 nm and supplied by Creo Products of Burnaby, Canada.

Deletion Gel A—Kodak Polychrome Graphics positive plate deletion gel.

Example 1

A printing form was prepared as follows:

Resin A, Resin B, Resin C and Resin D were dissolved in 1-methoxypropan-2-ol in the following proportions:

Resin A—10 wt %
Resin B—82 wt %
Resin C—4 wt %
Resin D—4 wt [{]ps

The dissolved composition was coated onto support A by means of a wire wound bar.

The solution concentrations were selected to provide the specified dry film composition with a coating weight of 2.0 $gm^{-2}$ after thorough drying at 110° C. for 90 seconds.

Example 2 (comparative)

A printing form was prepared as in Example 1 except the following components were dissolved in 1-methoxypropan-2-ol/DMF 70:30 (w:w), and coated onto supports A and B, to provide the specified dry film composition with a coating weight of 2.0 $gm^{-2}$ after thorough drying At 110° C. for 90 seconds.

Resin A—10 wt %
Resin B—86wt %
Dye A—2 wt %
Dye B—2 wt %

Testing

Samples of the printing plate precursor were imaged on the Trendsetter, using a 100% image (that is complete, total exposure) at 240 $mJcm^{-2}$. The exposed precursors were then developed by immersion in developer A at 20° C. for 2 minutes.

Precursors from Example 1 and from Example 2 on support A did not show any dye staining but those from Example 2 on support B were covered with a light blue/green stain. Thus in Example 1, the tagged dye did not deposit or remain in the areas from which the coating was removed, nor did the dye in the developer so deposit. Thus, plates from Example 1 on support A did not show any reduced color contrast between image and non-image areas, and were highly suitable for use as lithographic printing forms.

Areas of the precursors from Examples 1 and 2 that had been imaged with a 100% screen and then subsequently developed as described above were gummed and dried. Next they were treated with deletion gel A for 60 seconds. Then the gel was washed off and the precursors dried. A visual examination revealed that dye stain, in Example 2, support A precursors was removed by the deletion gel but in the case of Example 1 precursors and Example 2, support B precursors, no change in background color was seen, indicating that no dye stain was present.

What is claimed is:

1. A lithographic printing form precursor comprising:

an anodized aluminum support; and an imagable coating on the aluminum support, wherein the imagable coating comprises a polymeric substance having pendent colorant groups and reversible insolubilizer groups;

wherein the aluminum support has been anodized but not subsequently subjected to a chemical treatment step, and wherein the coating does not comprise a Arc colorant dye.

2. A precursor as claimed in claim 1, wherein the polymeric substance is derived from a polymer comprising hydroxyl groups, able to react with a colorant compound or moiety, to produce the polymeric substance having pendent colorant groups.

3. A precursor as claimed in claim 2, wherein the polymer comprising hydroxyl groups is a phenolic resin selected from the group consisting of a novolac resin, a resole resin, a novolac/resole resin mixture and polyhydroxystyrene, and a copolymer of hydroxystyrene.

4. A precursor as claimed in claim 2, wherein the colorant compound or moiety is selected from the group consisting of triarylmethane dyes, quaternized heterocyclic compounds, quinolinium compounds, benzothiazolium compounds, pyridinium compounds, polymethine dyes, cyanine dyes, Methylene blue, and a dye having the cation

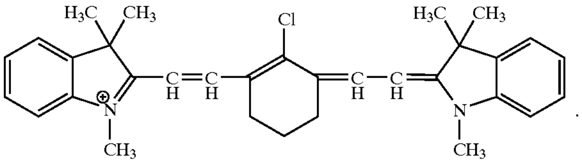

5. A precursor as claimed in claim 1, wherein the polymeric substance comprises infra-red absorbing groups.

6. A precursor as claimed in claim 5, wherein the infra-red absorbing groups are also colorant groups.

7. A precursor as claimed in claim 1, wherein the imagable coating comprises a free infra-red absorbing compound.

8. A precursor as claimed in claim 1, wherein the reversible insolubilizer groups are also colorant groups.

9. A precursor as claimed in claim 1, wherein the colorant groups also act as infra-red absorbing groups, and as reversible insolubilizer groups.

10. A precursor as claimed in claim 9, wherein the colorant groups are polymethine dyes or cyanine dyes.

11. A precursor as claimed in claim 1, wherein the imagable coating comprises a free compound which acts as a reversible insolubilizer compound.

12. A precursor as claimed in claim 11, wherein the free reversible insolubilizer compound is selected from the group consisting of naphthoflavone, 2,3-diphenyl-1-indeneone, flavone, flavanone, xanthone, benzophenone, N-(4-bromobutyl)phthalimide and phenanthrenequinone.

13. A precursor as claimed in claim 1, wherein the imagable coating comprises a pigment.

14. A precursor as claimed in claim 13, wherein the pigment is carbon black, lamp black, furnace black, channel black, iron (III) oxide, manganese oxide, Milori Blue, Paris Blue, Prussian Blue, Heliogen Green or Nigrosine Base NG1.

15. A printing form prepared from the lithographic printing form precursor of claim 1.

16. The precursor of claim 1, wherein the reversible insolubilizer groups are selected from the group consisting of —O—$SO_2$-tolyl, —O-dansyl, —O—$SO_2$-thienyl, —O—$SO_2$-naphthyl, —O—CO-Ph, and diazide functional groups.

17. A method of preparing a lithographic printing form precursor having an imagable coating on an aluminum support, the method comprising the steps of:

a) anodizing an aluminum support;

b) without having effected a chemical treatment step after the anodizing step, applying a composition comprising a polymeric substance having pendent colorant groups and reversible insolubilizer groups to the anodized surface of the aluminunm support; and c) drying the composition to form an imagable coating on the anodized surface, wherein the coating does not comprise a free colorant dye.

18. The method of claim 17, further comprising the step of reacting a polymer comprising hydroxyl groups with a colorant compound or moiety, to produce the polymeric substance having pendent colorant groups.

19. The method of claim 17, wherein the reversible insolubilizer groups are selected from the group consisting of —O—$SO_2$-tolyl, —O-dansyl, —O—$SO_2$-thienyl, —O—$SO_2$-naphthyl, —O—CO-Ph, and diazide functional groups.

20. A method for preparing a printing form comprising the steps of:

a) anodizing an aluminum support;

b) without having effected a chemical treatment step after the anodizing step, applying a composition comprising a polymeric substance having pendent colorant groups and reversible insolubilizer groups to the anodized surface of the aluminum support;

c) drying the composition to form an imagable coating on the anodized surface, wherein the coating does not comprise a free colorant dye;

d) exposing the coating imagewise, and;

e) removing the exposed regions of the coating using a developer liquid.

21. The method of claim 20, further comprising the step of reacting a polymer comprising hydroxyl groups with a colorant compound or moiety, to produce the polymeric substance having pendent colorant groups.

22. The method of claim 20, wherein the reversible insolubilizer groups are selected from the group consisting of —O—$SO_2$-tolyl, —O-dansyl, —O—$SO_2$-thienyl, —O—$SO_2$-naphthyl, —O—CO-Ph, and diazide functional groups.

* * * * *

UNITED STATES PATENT AND TRADEMARK OFFICE

CERTIFICATE OF CORRECTION

PATENT NO. : 6,777,164 B2
DATED : August 17, 2004
INVENTOR(S) : Geoffrey Horne et al.

It is certified that error appears in the above-identified patent and that said Letters Patent is hereby corrected as shown below:

Column 12,
Line 66, delete the word "Arc" and replace it with -- free --

Column 14,
Line 15, delete the word "aluminunm" and replace it with -- aluminum --

Signed and Sealed this

Eleventh Day of January, 2005

JON W. DUDAS
*Director of the United States Patent and Trademark Office*